United States Patent
Sasaki et al.

(10) Patent No.: US 9,812,233 B2
(45) Date of Patent: Nov. 7, 2017

(54) SUPERCONDUCTING OXIDE THIN FILM

(71) Applicant: FURUKAWA ELECTRIC CO., LTD., Tokyo (JP)

(72) Inventors: Hirokazu Sasaki, Tokyo (JP); Hajime Kasahara, Tokyo (JP); Kengo Nakao, Tokyo (JP); Masakazu Matsui, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 212 days.

(21) Appl. No.: 14/438,572

(22) PCT Filed: Oct. 29, 2013

(86) PCT No.: PCT/JP2013/079313
§ 371 (c)(1),
(2) Date: Apr. 24, 2015

(87) PCT Pub. No.: WO2014/069481
PCT Pub. Date: May 8, 2014

(65) Prior Publication Data
US 2015/0287502 A1    Oct. 8, 2015

(30) Foreign Application Priority Data

Nov. 2, 2012 (JP) .................... 2012-243004

(51) Int. Cl.
*H01B 12/06* (2006.01)
*H01L 39/12* (2006.01)
*H01L 39/24* (2006.01)

(52) U.S. Cl.
CPC .......... *H01B 12/06* (2013.01); *H01L 39/126* (2013.01); *H01L 39/2425* (2013.01)

(58) Field of Classification Search
CPC .............................. H01B 12/06; H01L 39/126
See application file for complete search history.

(56) References Cited

U.S. PATENT DOCUMENTS

| 5,128,316 A | 7/1992 | Agostinelli et al. |
| 6,083,885 A * | 7/2000 | Weinstein ........... H01L 39/2483 427/62 |
| 2002/0076567 A1* | 6/2002 | Honjo ................. H01L 39/2425 428/469 |

(Continued)

FOREIGN PATENT DOCUMENTS

| JP | H01-208319 A | 8/1989 |
| JP | H05-345613 A | 12/1993 |
| JP | H06-115935 A | 4/1994 |

(Continued)

OTHER PUBLICATIONS

Machine translation of JP 2007-311234, 2007.*

(Continued)

*Primary Examiner* — Paul Wartalowicz
(74) *Attorney, Agent, or Firm* — Amin, Turocy & Watson, LLP (57) ABSTRACT

A superconducting oxide thin film includes a superconducting layer formed on a supporting material. The superconducting layer includes an RE-based superconductor as a main component, and the RE-based superconductor includes a CuO chain that has a Cu vacancy portion.

7 Claims, 8 Drawing Sheets

(56) References Cited

U.S. PATENT DOCUMENTS

2010/0197506 A1* 8/2010 Takahashi ........... H01L 39/2461
505/230

FOREIGN PATENT DOCUMENTS

| JP | H07-330332 A | | 12/1995 | |
|---|---|---|---|---|
| JP | 2007-311234 | * | 11/2007 | ............. C23C 14/08 |
| JP | 2012-066960 A | | 4/2012 | |

OTHER PUBLICATIONS

Yamada, et al. "Epitaxial nanostructure and defects effective for pinning in Y ( RE ) Ba 2 Cu 3 O 7-x coated conductors" Applied Physics Letters, vol. 87, 2005, 4 pages.

Miura, et al. "Magnetic Field Angular Dependence of Critical Current in Y1—xSmxBa2Cu3Oy Coated Conductors with Nanoparticles Derived from the TFA-MOD Process" Teion Kogaku (J. Cryo. Soc. Jpn.) vol. 44, No. 5, 2009, 7 pages.

Antal, et al. "Flux pinning in Al doped TSMG YbCO bulk superconductors" Superconductor Science and Technology, vol. 22, Aug. 2009, 8 pages.

International Search Report for PCT Application No. PCT/JP2013/079313, dated Feb. 4, 2014, 4 pages.

Zheng Xu, et al. "Modem Functional Ceramics", 1st edition, Sep. 1998, pp. 164-166.

Chinese Office Action dated May 5, 2016 for Chinese Patent Application No. 201380054871.5, 4 pages.

Japanese Office Action dated Jun. 13, 2017 for Japanese Application Serial No. 2014-544533, 5 pages (with English machine translation).

Oda, et al., "Superconductivity Tetragonal Phase in Y—Ba—Cu—O Coated High-Temperature Superconductors" from "News of Low Temperature Center, Osaka University", Low Temperature Center, Osaka University, Jul. 1988, No. 63, 6 pages.

Kato, "Microscopic Assessments of High Oxygen Pressure Synthesis and Structure/Physical Properties of Bi-based and Y-based Copper Oxide High-Temperature Superconductors", Academic Dissertation, Kyoto University, Japan, Nov. 25, 1997, 93 pages.

* cited by examiner

SUPERCONDUCTING OXIDE THIN FILM

CROSS-REFERENCE TO RELATED APPLICATIONS

This application is a U.S. National Stage application filing under 35 USC §371 of International Application No. PCT/JP2013/079313, filed on Oct. 29, 2013, entitled "SUPERCONDUCTIVE THIN OXIDE FILM," which claims priority to Japanese Application No. 2012-243004, filed on Nov. 2, 2012, both of which are incorporated herein by reference in their entireties.

TECHNICAL FIELD

The present invention relates to a superconducting oxide thin film.

BACKGROUND ART

Hitherto, as a technology for realizing an oxide superconductor material, there has been a method in which a substrate is prepared, and an oxide superconductor is deposited on the substrate to obtain a superconducting oxide thin film.

For example, RE-based superconductors (RE: rare earth element) that exhibit superconducting phenomena at the temperature of liquid nitrogen (77K) or above, and in particular, yttrium-based superconductors represented by the composition formula $YBa_2Cu_3O_{7-\delta}$ (represented by YBCO below), are often employed as oxide superconductors for forming a film. It is hoped that superconducting oxide thin films that employ such an RE-based superconductor will be applied to superconducting fault-current limiters, cables, superconducting magnetic energy storages (SMES), and the like, and RE-based superconductors and methods for their manufacture are attracting much attention.

Superconducting oxide thin films formed using a pure RE-based superconductor so as to have favorable crystal orientations, generally exhibit a characteristic of having a high critical current in the absence of a magnetic field. However, pure RE-based superconductors have a problem in that the critical current characteristic thereof rapidly decreases in high magnetic fields.

In order to enhance the critical current characteristic in a magnetic field, a pinning center is needed to prevent movement of quantized magnetic flux. Although normal conductor precipitates, stacking faults, dislocations, and the like are said to be effective pinning centers, it is not easy to produce a superconducting thin film while controlling these phenomena. In view of these circumstances, attempts has recently been made to introduce pinning centers artificially. It has been reported that artificially introducing BaZrO nanorods into YBCO as pinning centers enhances magnetic field characteristics (see, for example, Y. Yamada, K. Takahashi, H. Kobayashi, M. Konishi, T. Watanabe, A. Ibi, T. Muroga, S. Miyata, T. Kato, T. Hirayama, Y. Shiohara, "Epitaxial nanostructure and defects effective for pinning in Y(RE) $Ba_2Cu_3O_{7-x}$ coated conductors", Appl. Phys. Lett., 2005, vol. 87, p. 132-502). However, in the case of nanorods, although the current characteristic at a specific angle under application of a magnetic field is high due to the presence of a one-dimensional normal conductive region, the current characteristic is lower at other angles. In order to isotropically increase the current characteristic under application of a magnetic field, it is preferable to introduce three-dimensional pinning centers formed by nanoparticles dispersed in three-dimensions (see, for example, Masashi Miura, Takeharu Kato, Masateru Yoshizumi, Yutaka Yamada, Teruo Izumi, Tsukasa Hirayama, and Yuh Shiohara: "Magnetic field angular dependence of critical current in $Y_{1-x}Sm_xBa_2Cu_3O_y$ coated conductors with nanoparticles derived from the TFA-MOD process", TEION KOGAKU (J. Cryo. Soc. Jpn.) Vol. 44 No. 5 (2009)). Attempts have been in made to introduce pinning centers by doping YBCO with Al such that some of the Cu atoms in the CuO chains are replaced by Al atoms (see, for example, V. Antal, M. Kanuchova, M. Sefcikova, J. Kovac, P. Diko, M. Eisterer, N. Horhager, M. Zehetmayer, H. W. Weber, X. Chaud, "Flux pinning in Al doped TSMG YBCO bulk superconductors", Supercond. Sci. Technol., 2009, vol. 22, 105001), and to substitute some of the Cu atom sites of YBCO with various metal elements (see, for example, Japanese Patent Application Laid-Open (JP-A) No. H07-330332).

SUMMARY OF INVENTION

Technical Problem

Many of pinning centers for immobilizing quantized magnetic flux involve formation of nonosized normal conducting phases by the introduction of elements other than the elements Y, Ba, Cu, O that constitute YBCO, as illustrated in the prior art documents. Stable formation of a normal conducting phase is not easy in such cases, and the greater the number of constituent elements, the more unstable the manufacturing process becomes. From the viewpoint of cost also, methods that do not employ, for example, metal impurities such as rare metals are preferable. It is accordingly preferable to manufacture pinning centers constituted only by Y, Ba, Cu, and O.

The present invention has been made in consideration of the above, and aims to provide a superconducting oxide thin film capable of exhibiting a high critical current characteristic due to introduction of a pinning center within a single phase without introducing heterogeneous additive elements such as Zr.

Solution to Problem

In order to solve the above problem, a superconducting oxide thin film according to the invention includes a superconducting layer that includes an RE-based superconductor as the main component, wherein the RE-based superconductor includes a CuO chain, and some of the CuO atoms of the CuO chain are missing.

Causing Cu vacancies in the CuO chain enables introduction of pinning centers without increasing the number of types of raw materials. Typical modes that CuO chains can take are CuO single chains, in which CuO chains are arranged in a single layer, and CuO double chains, in which CuO chains are arranged in two layers. Cu vacancies may be introduced in CuO single chains, CuO double chains, or both. Namely, the superconducting oxide thin film may have a configuration in which some of the Cu atoms in CuO single chains are missing and/or some of the Cu atoms in CuO double chains are missing. Stress is imparted by the Cu vacancies to regions around the Cu vacancies, as a result of which the $T_c$ changes, and Cu vacancy portions act as pinning centers. Note that any Cu vacancy portions present in the $CuO_2$ planes where superconducting current flows will diminish the superconducting current properties, and are not preferable.

The amount of oxygen atom vacancies in the CuO chains may vary according the δ value of $YBa_2Cu_3O_{7-\delta}$. If such oxygen atom vacancies are present in a row, then they may act as a one-dimensional pinning center, and so an increase in critical current value is expected. An example thereof is a superconducting oxide thin film in which consecutive vacancies of O occur in one CuO chain among CuO chains configuring a CuO double chain.

Causing Cu vacancies in $CuO_2$ planes decreases the superconducting current since the superconducting current flows along the $CuO_2$ planes, as described in JP-A No. H07-206437. It is accordingly important to selectively form Cu vacancies in CuO chains, without causing Cu vacancies in $CuO_2$ planes.

Specifically, the following <1> to <7> are provided according to the invention.

<1> A superconducting oxide thin film, including a superconducting layer formed on a supporting material, the superconducting layer including an RE-based superconductor as the main component, and the RE-based superconductor including a CuO chain having a Cu vacancy portion.

<2> The superconducting oxide thin film according to <1>, wherein the RE-based superconductor includes a CuO single chain as the CuO chain, and the Cu vacancy portion is a linear defect formed by consecutive vacancies of Cu atoms in the CuO single chain.

<3> The superconducting oxide thin film according to <2>, wherein the Cu vacancy portion is a linear defect formed by consecutive vacancies of Cu atoms along a chain direction in the CuO single chain.

<4> The superconducting oxide thin film according to <1> or <2>, wherein the RE-based superconductor includes a CuO single chain as the CuO chain, the Cu vacancy portion is formed by consecutive vacancies of Cu atoms in the CuO single chain along a b-axis direction of a crystal structure of the RE-based superconductor, and the RE-based superconductor includes plural Cu vacancy portions along an a-axis direction of the crystal structure, and includes Cu atoms at positions between the plural Cu vacancy portions arranged in the a-axis direction.

<5> The superconducting oxide thin film according to <1>, wherein the RE-based superconductor includes a CuO double chain as the CuO chain, and the Cu vacancy portion is formed by consecutive vacancies of Cu atoms in a chain direction in at least one CuO chain of two CuO chains in the CuO double chain.

<6> The superconducting oxide thin film according to <1>, wherein the RE-based superconductor includes a CuO single chain and a CuO double chain as the CuO chain, and the Cu vacancy portion is formed by consecutive vacancies of Cu atoms in a chain direction in at least one CuO chain among plural CuO chains configuring the CuO single chain and the CuO double chain.

<7> The superconducting oxide thin film according to any one of <1> to <6>, wherein the RE-based superconductor includes a CuO double chain as the CuO chain, and an oxygen atom vacancy is included in one CuO chain among CuO chains configuring the CuO double chain.

Advantageous Effect of Invention

According to the invention, a superconducting oxide thin film can be provided which is capable of exhibiting a high critical current characteristic due to introduction of a pinning center within a single phase without introducing heterogeneous additive elements such as Zr.

DESCRIPTION OF EMBODIMENTS

Detailed explanation follows regarding a mode of implementing the invention (referred to as an "embodiment" below), with reference to the appended drawings.

In the invention, oxide superconductors that include an RE (rare earth element), and that are represented by composition formulas such as $REBa_2Cu_3O_{7-\delta}$ (RE-123), $REBa_2Cu_4O_8$ (RE-124), and $REBa_4Cu_7O_{15-\delta}$ (RE-247) are referred to as RE-based superconductors and denoted "REBCO" hereinafter. In particular, Y-based superconductors represented by composition formulas such as $YBa_2Cu_3O_{7-\delta}$ (Y-123), $YBa_2Cu_4O_8$ (Y-124), and $Y_2Ba_4Cu_7O_{15-\delta}$ (Y-247), are denoted "YBCO".

Figure 1:
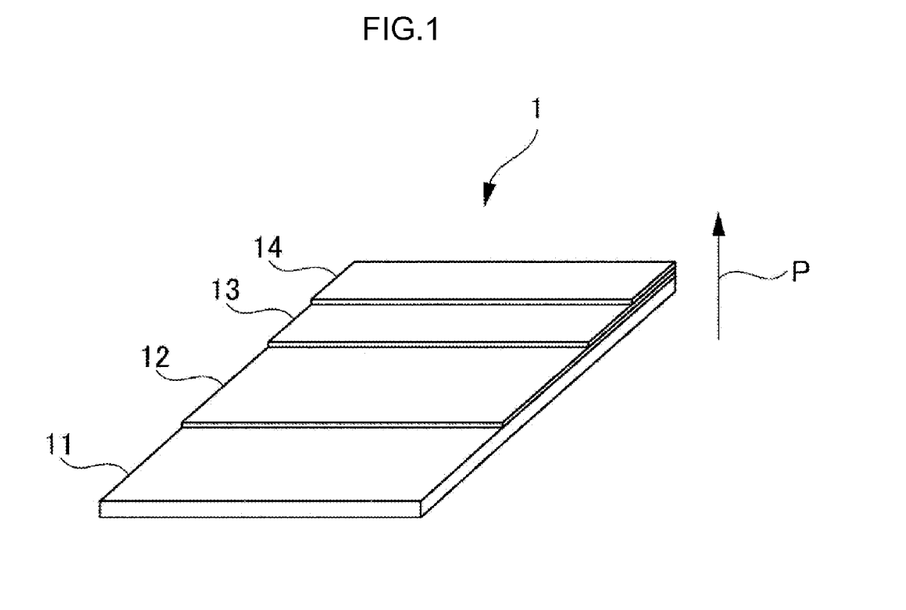
FIG. 1 is a perspective view illustrating a layer structure of a superconducting oxide thin film according to an embodiment of the invention.

FIG. 1 is a diagram illustrating a layer structure of a superconducting oxide thin film according to an embodiment of the invention. As illustrated in FIG. 1, a superconducting oxide thin film 1 includes a layer structure in which an intermediate layer 12, a superconducting layer 13, and a stabilizing layer (protective layer) 14 are formed on a substrate 11, in sequence along a stacking direction P. Although the total structure including the substrate 11, and the intermediate layer 12 if present, is referred to as a "supporting material", the intermediate layer 12 may be omitted in cases in which the superconducting layer 13 can be orientated directly on the substrate 11.

A metal substrate with low magnetism, or a ceramic substrate may be employed as the substrate 11. The shape of the substrate 11 is not particularly limited as long as there is a main face, and substrates of various shapes, such as plate materials, wire materials, and bar materials, may be employed. For example, when a tape-shaped supporting material is employed, the superconducting oxide thin film 1 may be employed as a superconducting wire material.

For example, metals having high strength and heat resistance, such as Cr, Cu, Ni, Ti, Mo, Nb, Ta, W, Mn, Fe, and Ag, and metal alloys that include any of these metals, may be employed as metal substrates. Stainless steels, HASTELLOY (registered trademark), and other nickel alloys have excellent corrosion resistance and heat resistance, and are particularly preferable. Moreover, various ceramics may be placed on these metal materials. For example, $Al_2O_3$, MgO, $SrTiO_3$, yttrium-stabilized zirconia, sapphire, or the like, may be employed as a ceramic substrate.

Although not particularly limited, the thickness of the substrate 11 is, for example, 1 mm.

The intermediate layer 12 is a layer that is formed on a main face of the substrate 11 in order to achieve high in-plane orientation in the superconducting layer 13, and is adjacent to the substrate 11 side of the superconducting layer 13. The intermediate layer 12 may be configured as a single layer film, or may be configured as a multi-layer film. Although not particularly limited, the uppermost layer (the layer at the superconducting layer 13 side) of the intermediate layer 12 is, for example, a substance selected from the group consisting of $CeO_2$ and $REMnO_3$. Although not particularly limited, the film thickness of the intermediate layer 12 is, for example, 20 nm.

The superconducting layer 13 is formed on the intermediate layer 12, and includes an RE-based superconductor as the main component. "Main component" refers to the component with the highest content (by mass) in the superconducting layer 13, among the constituent components included the superconducting layer 13, and preferably has a content exceeding 90% by mass. Typical examples of the RE-based superconductor include $REBa_2Cu_3O_{7-\delta}$ (RE-123), $REBa_2Cu_4O_8$ (RE-124), and $RE_2Ba_4Cu_7O_{15-\delta}$ (RE-247). Each of these RE-based superconductors adopt a layered perovskite structure, and the internal structure may be divided into portions in which RE, Ba, and Cu form a perovskite structure with O, and portions in which Cu and O bind in chains. The perovskite structured portions have $CuO_2$ planes in the structure thereof and are known to be portions through which superconducting current flows. In the CuO chain portions, CuO single chains each of which has only a single CuO chain, and/or CuO double chains each of which has a double CuO chain structure, may be present. A substance in which all of the CuO chains are single chains is referred to as RE-123, a substance in which single chains and double chains are present alternately is referred to as RE-247, and a substance in which all of the CuO chains are double chains is referred to as RE-124.

Figure 2A:
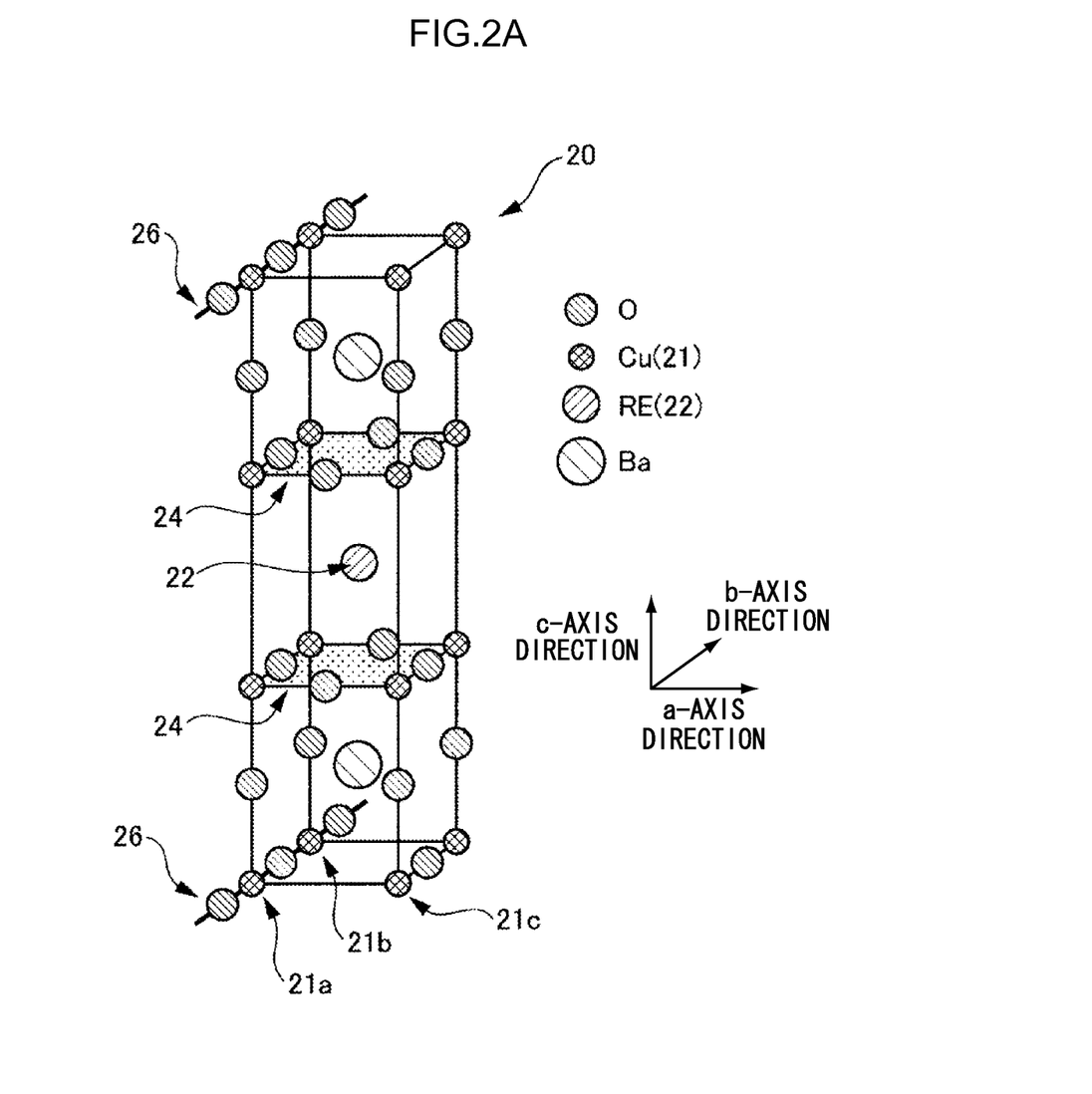
FIG. 2A to FIG. 2C are diagrams illustrating examples of a crystal structure of an RE-based superconductor constituting the superconducting layer illustrated in FIG. 1.
Figure 2B:
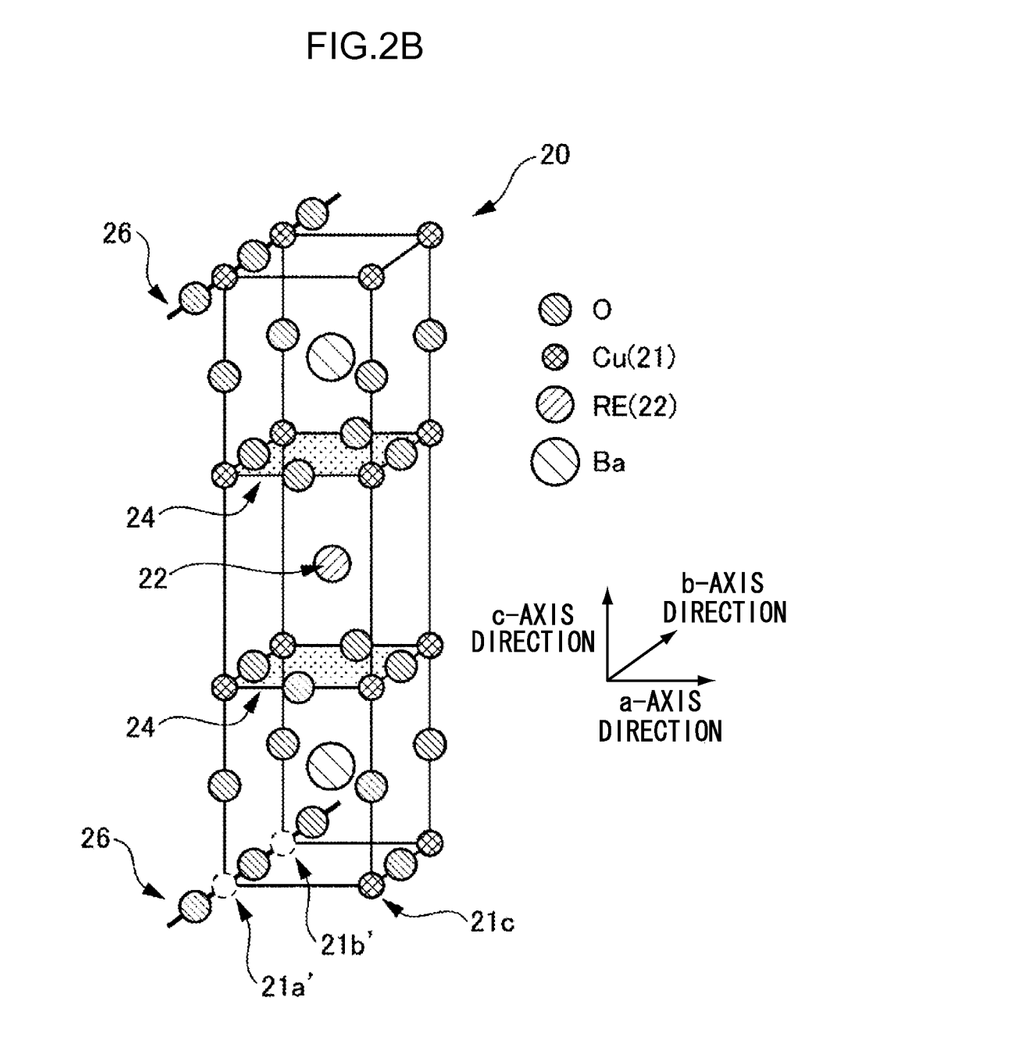
Figure 2C:
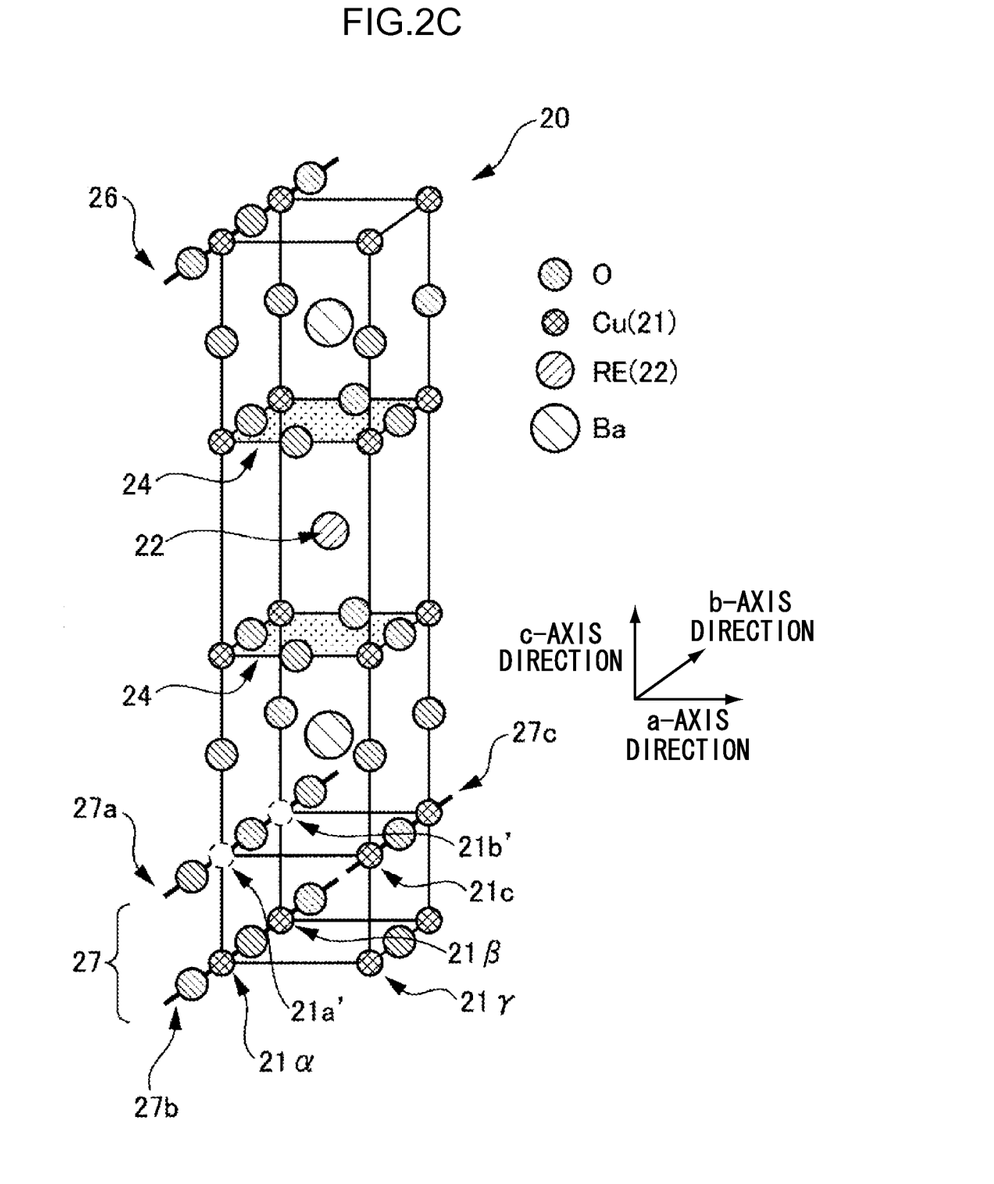

FIG. 2A to 2C illustrate $REBa_2Cu_3O_{7-\delta}$ (RE-123) crystal structures as examples of an RE-based superconductor 20 that configures the superconducting layer 13 illustrated in FIG. 1. The crystal structure illustrated in FIG. 2A as a whole illustrates a unit cell of RE-123. The RE-based superconductor 20 in the present embodiment is not necessarily configured by RE-123 alone. There is also a case in which RE-based superconductor 20 also includes RE-124 in which CuO single chain portions of RE-123 are substituted with CuO double chains, or RE-247 in which structures of RE-123 and RE-124 alternate every period, and in which the crystal structure of RE-123 illustrated by the entire FIG. 2A configures some of the unit cells of the RE-based superconductor 20. The superconducting layer 13 is configured such that two or more such unit cells are arranged along each of the stacking direction P and lateral direction.

As illustrated in FIG. 2A, RE-123 includes, within a unit cell thereof, a $CuO_2$ plane 24 positioned at both sides in the c-axis direction of RE 22, and a CuO single chain 26 positioned further outside in the c-axis direction than the $CuO_2$ plane 24 when the RE 22 serves as the basis position.

The RE is a single rare earth element or plural rare earth elements selected from the group consisting of Y, Nd, Sm, Eu, Gd, Dy, Ho, Er, Tm, Yb, and Lu, and of these, Y is preferable for reasons such as that substitution between Ba sites and Y do not easily occur. Moreover, $\delta$ is an oxygen non-stoichiometric ratio and is, for example, from 0 to 1, and a value closer to 0 is more preferred from the viewpoint of achieving a high superconducting phase transition temperature. The oxygen non-stoichiometric ratio $\delta$ can be less than 0, namely, a negative value, when, for example, high pressure oxygen annealing is performed using a device such as an autoclave. Although not particularly limited, the film thickness of the superconducting layer 13 is, for example, 200 nm.

FIG. 2B illustrates an RE-123 crystal structure that has a Cu vacancy portion ($21a'$ and $21b'$) formed due to some of the Cu atoms ($21a$ and $21b$) missing from a CuO single chain 26, among the plural CuO single chains 26 included in the crystal structure of RE-123 of FIG. 2A.

FIG. 2C is a crystal structure of an RE-based superconductor that includes a CuO double chain, in which some of the Cu atoms of a single CuO chain $27a$ are missing from a CuO double chain 27, and a Cu vacancy portion ($21a'$, $21b'$) is formed by the empty lattice sites. Note that a configuration may be adopted in which both CuO chains $27a$ and $27b$ of the CuO double chain 27 have a Cu vacancy portion, and, similarly to in FIG. 2B, when the CuO chain $27a$ has the Cu vacancy portion $21a'$-$21b'$, the Cu atoms ($21\alpha$ and $21\beta$) in the CuO chain $27b$, which correspond to the Cu vacancy portion in the CuO chain $27a$, may also be missing.

In each of the Cu vacancy portions illustrated in FIG. 2B and FIG. 2C, plural Cu atoms that are adjacent to each other in the chain direction are missing, forming a linear defect; however, Cu vacancy portions are not limited thereto.

For example, in FIG. 2A, a configuration may be adopted in which only a Cu atom ($21a$), among the Cu atoms ($21a$ and $21b$) of the CuO single chain 26, is missing to form a Cu vacancy portion ($21a'$), while another Cu atom ($21b$) is left as it is rather than being removed. Also in FIG. 2C, a configuration may be adopted in which only a Cu atom ($21a$), among the Cu atoms in the CuO chains $27a$ and $27b$ of the CuO double chain 27, is missing to form a Cu vacancy portion ($21a'$) or a configuration may be adopted in which only the two Cu atoms ($21a$ and $21\beta$), among the Cu atoms in the CuO chains $27a$ and $27b$ of the CuO double chain 27, are missing to form a Cu vacancy portion ($21a'$, $21\beta'$). In the case of these types of Cu vacancy portions, consecutive vacancies of adjacent Cu atoms do not occur, so that point defects are formed.

As described above, the Cu vacancy portion may be either a point defect or a linear defect. However, when the Cu vacancy portion is a point defect, there are cases where the power to immobilize quantized magnetic flux is insufficient in a high magnetic field of, for example, approximately 5 T; therefore, the Cu vacancy portion is preferably a linear defect when employed in a high magnetic field.

The stabilizing layer 14 is formed on the superconducting layer 13, and is configured by, for example, Au, Ag, Cu, or the like. Although not particularly limited, the film thickness of the stabilizing layer 14 is, for example, 200 nm.

Manufacture of Thin film Superconducting Element

In the present embodiment, a thin film superconducting element including a superconducting oxide thin film in which normal YBCO (Y-123), and a superlattice structure thereof (including simple lamination defects and modulated structures) or the like are present in mixture in a superconducting layer, is manufactured.

Firstly, a sapphire substrate is prepared of which the main face corresponds to the r plane direction of a sapphire single crystal, and the sapphire substrate is pre-annealed at 1000° C. Next, plasma is generated in oxygen at $3\times10^{-2}$ Pa using an electron beam deposition method, and, in a state in which the sapphire substrate is heated at 750° C., $CeO_2$ is deposited, to an approximately 20 nm, on a cut face of the sapphire substrate, thereby forming an intermediate layer. The substrate is then post-annealed at 800° C., and surface processing (flattening/valence control) is performed on the intermediate layer.

Next, a solution of organic complexes of Y, Ba, and Cu is applied to the surface of the intermediate layer using a spin coater, and then preliminary sintering and sintering are performed. The preliminary sintering is performed in air at 510° C., and then the temperature is increased to 780° C. in an atmosphere having an oxygen concentration of from 10 ppm to 100 ppm, and sintering is performed. The atmosphere is then replaced by a 100% oxygen atmosphere while decreasing the temperature. A YBCO layer in which some Cu atoms in CuO single chains are missing and/or some Cu atoms in CuO double chains are missing is thereby formed. A superconducting oxide thin film is produced by this manufacturing process.

Figure 6:
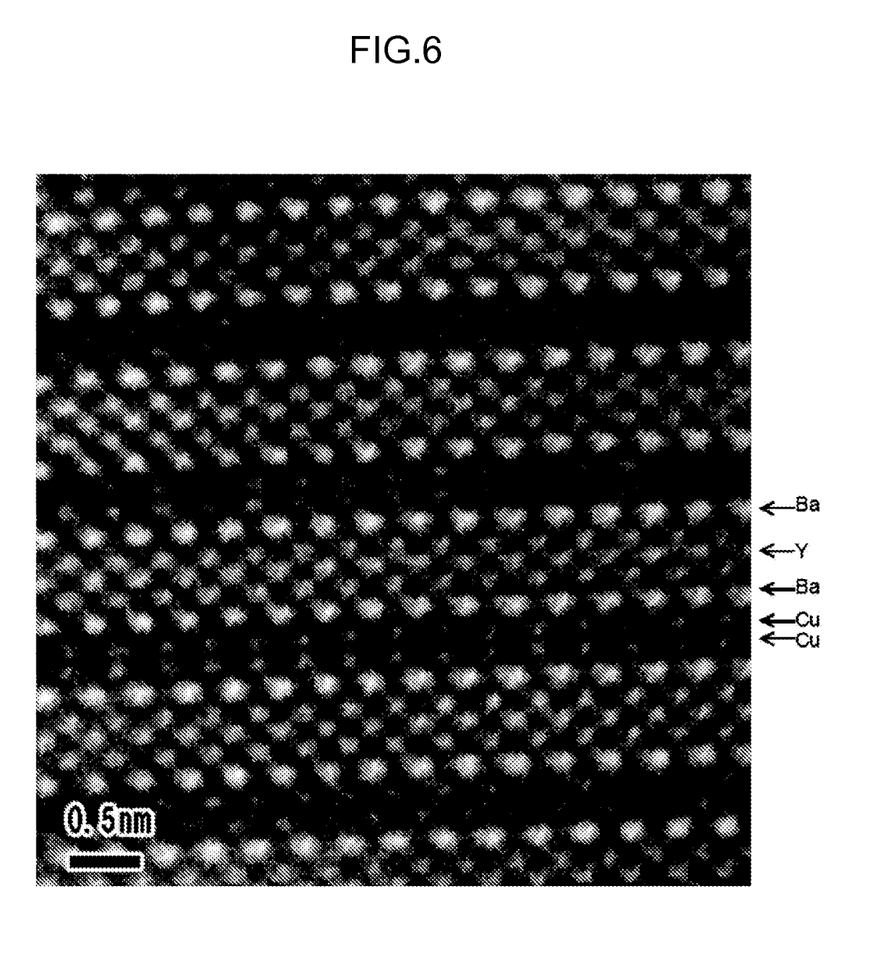
FIG. 6 is a diagram illustrating a TEM image of a YBCO layer according to Comparative Example 1.

FIG. 6 illustrates a TEM image of a YBCO layer; as described below, this YBCO layer was obtained by performing the same processes as those described above up to formation of the $CeO_2$ intermediate layer, preliminarily sintering a solution of organic complexes of Y, Ba, and Cu that had been applied to the surface of the intermediate layer using a spin coater, at 500° C. in air, and then increasing the temperature to 800° C. in an atmosphere with an oxygen concentration of from 10 ppm to 100 ppm and performing sintering, and then replacing the atmosphere with a 100% oxygen atmosphere while decreasing the temperature.

FIG. 6 clearly demonstrates that Cu vacancies do not arise in the YBCO layer when preliminary sintering is performed in air at 500° C. and sintering is performed by increasing the temperature to 800° C. in an atmosphere with an oxygen concentration of from 10 ppm to 100 ppm.

Figure 3:
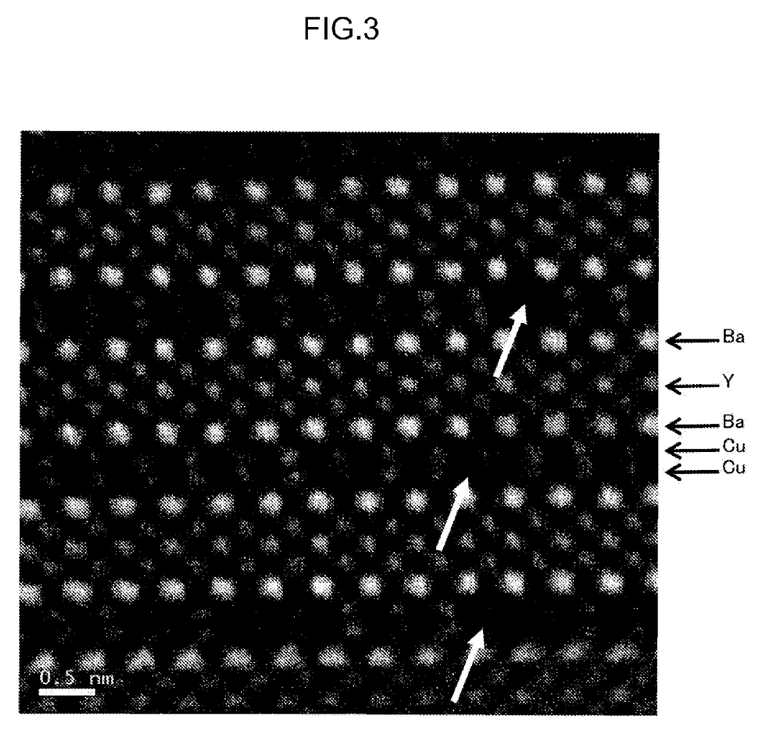
FIG. 3 is a diagram illustrating a TEM image of an RE-based superconductor layer according to an embodiment of the invention.

FIG. 3 illustrates a TEM image of a YBCO layer obtained by performing the same processes as those described above up to formation of the $CeO_2$ intermediate layer, preliminarily sintering a solution of organic complexes of Y, Ba, and Cu that had been applied to the surface of the intermediate layer using a spin coater, at 510° C. in air, and then increasing the temperature to 780° C. in an atmosphere with an oxygen concentration of from 10 ppm to 100 ppm and performing sintering, and then replacing the atmosphere with a 100% oxygen atmosphere while decreasing the temperature.

FIG. 3 clearly demonstrates that Cu vacancy portions are typically observed in CuO chains (CuO double chains) of the YBCO layer, as indicated by the white arrows, in a case in which preliminary sintering is performed in air at 510° C., and in which sintering is performed by increasing the temperature to 780° C. in an atmosphere with an oxygen concentration of from 10 ppm to 100 ppm.

Specifically, in the TEM image of FIG. 6, plural Cu atoms are regularly disposed along the lateral direction in the Cu double chains, and Cu is always present at positions corresponding to positions between one Ba atom and another Ba atom arranged along the lateral direction, from among the plural Ba atoms present above and below Cu atoms. In contrast, in the TEM image of FIG. 3, Cu is not always present at positions corresponding to positions between one Ba atom and another Ba atom arranged along the lateral direction, from among the plural Ba atoms present above and below Cu atoms, and Cu atoms are missing irregularly. Moreover, at portions where Cu atoms are missing (Cu vacancy portions), with respect to the lateral direction in FIG. 3, adjacent Cu atoms are not consecutively missing, and Cu is always present between one Cu vacancy portion and another Cu vacancy portion.

Such Cu vacancy portions are formed such that Cu atoms consecutively arranged in a direction perpendicular to page of the TEM image of FIG. 3 are missing, whereby linear defects, which are one-dimensional structural defects, are formed. Such linear defects, namely Cu vacancy portions, act as pinning centers.

When Cu vacancy portions are formed consecutively in the direction perpendicular to the page of the TEM image of FIG. 3 and also in the lateral direction, such Cu vacancy portions are present as planar defects in the ab-plane rather than forming linear defects, and may cause disturbances to the structure of the $CuO_2$ planes. Thus, Cu vacancy portions that are consecutive in the direction perpendicular to the page of the TEM image as well as in the lateral direction may cause the superconducting current characteristic to be diminished, and are therefore not preferable. It is therefore preferable for Cu to be always present between one Cu vacancy portion and another Cu vacancy portion, such that Cu vacancy portions are not consecutive in the lateral direction of the TEM image of FIG. 3. Namely, it is preferable that the Cu vacancy portions are present as linear defects in the ab-plane, rather than as planar defects in the ab-plane.

In Cu vacancy portions in CuO chains, Cu atoms (21*a* and 21*b*) may be consecutively missing from one CuO chain 26 in FIGS. 2A to 2C along the chain direction (the b-axis direction), or Cu atoms (21*a* and 21*c*) that are present at positions in adjacent CuO single chains 26 mutually corresponding in the a-axis direction may be consecutively missing.

However, for reasons relating to ease of control during manufacture, Cu vacancy portions in CuO chains are preferably formed by consecutive absence (21*a*' and 21*b*') of Cu atoms (21*a* and 21*b*) in one CuO single chain 26 along the chain direction (the b-axis direction), as illustrated in FIG. 2B.

In RE-based superconductors that include CuO double chains, Cu atoms (21*a*' and 21*b*') may be consecutively missing, along the chain direction (the b-axis direction), from at least one CuO chain 27*a* of the two CuO chains (27*a* and 27*b*) in the CuO double chain 27 as illustrated in FIG. 2C, or Cu may be consecutively missing at Cu vacancy portion 21*a*' in the CuO chain 27*a* and at a Cu atom (21*c*) that is present at a corresponding position in the a-axis direction (position adjacent to 21*a*') in the CuO chain 27*c*.

However, for reasons related to ease of control during manufacture, Cu vacancy portions in CuO chains are preferably formed by consecutive absence (21*a*' and 21*b*') of Cu atoms in one CuO chain 27*a* along the chain direction (the b-axis direction), as illustrated in FIG. 2C. Cu vacancy portions may be present in both of the CuO chains 27*a* and 27*b* in the CuO double chain 27, and Cu atoms (21α and 21β) in the CuO chain 27*b*, which correspond to the Cu vacancy portions (21*a*' and 21*b*') in the CuO chain 27*a*, may be missing.

In an RE-based superconductor including a CuO double chain, it is more preferable that O vacancies occur in only one CuO chain among the chains constituting a CuO double chain. As a result of introduction of an oxygen (O) vacancy into only one of the CuO chains that constitute a CuO double chain, the oxygen vacancy portion also acts as a pinning center, and contributes to an increase in $J_c$.

Combinations of preliminary sintering conditions and sintering conditions for providing such Cu vacancy portions serving as pinning centers may be optimized according to desired magnetic field-critical current characteristics of the YBCO layer, namely the arrangement and distribution of quantized magnetic flux.

EXAMPLES

Description of examples follows; however, these examples do not restrict the invention in any way.

Example 1

A thin film superconducting element in which a superconducting oxide thin film having normal YBCO (Y-123), and a superlattice structure thereof (including simple lamination defects and modulated structures) or the like are present in mixture in a superconducting layer was produced through the same processes as those described above (under Manufacture of Thin film Superconducting Elements).

A YBCO layer was obtained by preliminarily sintering a solution of organic complexes of Y, Ba, and Cu that had been applied onto the surface of a $CeO_2$ intermediate layer using a spin coater, in air at 510° C., then increasing the temperature to 780° C. in an atmosphere with an oxygen concentration of from 10 ppm to 100 ppm and performing sintering, and then replacing the atmosphere by 100% oxygen atmosphere while decreasing the temperature. A YBCO layer was thereby formed in which Cu vacancies occur only in CuO chains. A superconducting oxide thin film was produced by the manufacturing process above.

A thin film superconducting element was produced by depositing a gold-silver alloy on the obtained superconducting oxide thin film using a sputtering method, and attaching electrodes thereto.

Inspection of this sample was performed using transmission electron microscopy (TEM). A focused ion beam (FIB) method was employed in the TEM sample preparation, with a Ga ion beam acceleration voltage of 30 kV. Then, 30 minutes of irradiation with a 1 kV Ar ion beam was performed in order to erase damage to the sample face caused by the FIB. Using this method, a sample that can be inspected clearly using STEM was prepared.

Figure 4:
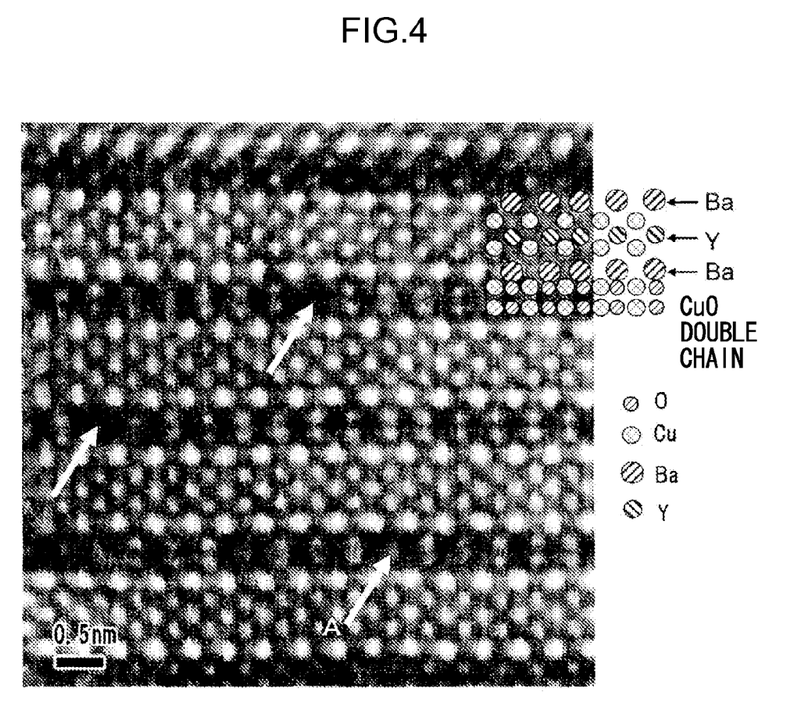
FIG. 4 is a diagram illustrating a TEM image of a YBCO layer in Example 1 according to an embodiment of the invention.

The results of the TEM inspection are illustrated in FIG. 4. A high angle annular dark field-scanning transmission electron microscopy (HAADF-STEM) image was acquired using an aberration corrected scanning transmission electron microscopy (STEM) 2100F manufactured by JEOL, Ltd. The incidence direction of the electron beam is the (100) direction. As illustrated in the drawing, many double CuO chains (CuO double chains) are formed. A situation is observed in which some of the Cu atoms are missing from the double CuO chains, as indicated by the white arrows in the drawing. Moreover, it is confirmed that, in a double CuO chain (at the white arrows A), a pair of upper and lower Cu atoms have been replaced by a single Cu atom.

Here, each of the Cu vacancy portions indicated by the white arrows represents a vacancy of plural Cu atoms in a direction perpendicular to the page. When only one Cu atom is missing in the direction perpendicular to the page, Cu can be observed faintly in the TEM image. However, Cu atoms are not observed at the Cu vacancy portions indicated by the white arrows in the TEM image of FIG. 4, suggesting that Cu vacancy portions are formed by the absence of plural Cu atoms along the direction perpendicular to the page as described above, and that the Cu vacancy portions are linear defects. Note that Cu vacancies within $CuO_2$ planes, such as those described in JP-A H07-206437, are not observed in this experiment.

It was calculated from the TEM image obtained by aberration corrected STEM, that there are 22,100 sites/$\mu m^2$ where a pair of upper and lower Cu atoms in a double CuO chain have been replaced by a single Cu atom, and 19,600 sites/$\mu m^2$ where a pair of upper and lower Cu atoms are both missing from a double CuO chain. Changing the manufacturing conditions enables the density of Cu vacancies, which serve as pinning centers in the CuO chains, to be optimized according to the distribution of the quantized magnetic flux in the driving magnetic field unique to the apparatus to which the RE oxide superconducting thin film according to the invention is to be applied.

In particular, when used in a high magnetic field application in which the generated magnetic field is 5 T or more, the number Cu vacancy sites in the CuO chains is preferably 15,000 sites/$\mu m^2$ or more, and is more preferably 20,000 sites/$\mu m^2$ or more. However, since the critical temperature $T_c$ is reduced when the amount of vacancies in the superconducting layer is too great, the number of Cu vacancy sites in the CuO chains is preferably 50,000 sites/$\mu m^2$ or less.

The YBCO superconducting thin film that includes pinning centers related to these Cu vacancy portions exhibited a high critical current density of $Jc=4.5$ $MA/cm^2$.

Figure 5:
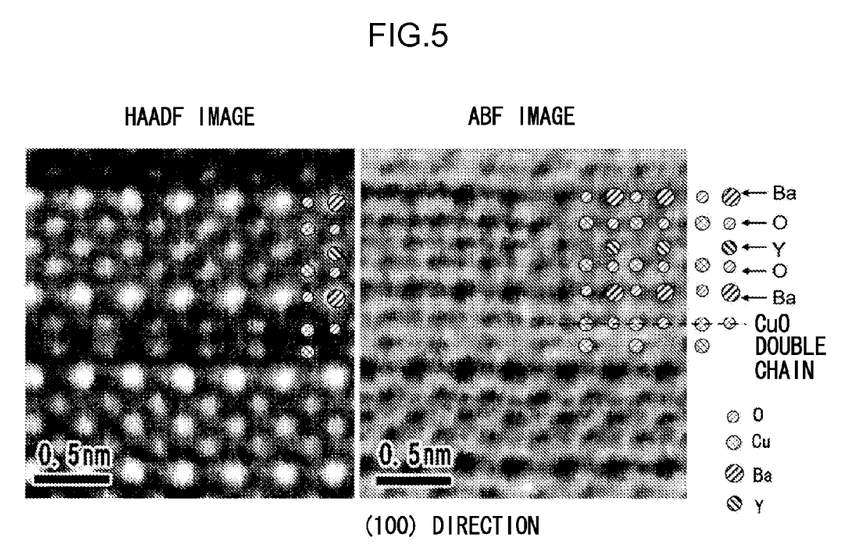
FIG. 5 is a diagram illustrating a HAADF image and an ABF image of a YBCO layer obtained by aberration corrected STEM, in Example 1 according to an embodiment of the invention.

FIG. 5 illustrates a HAADF image and an annular bright field (ABF) image obtained using aberration corrected STEM. ABF imaging is a method that enables atoms of light elements such as oxygen to be observed. However, in HAADF images, although Y, Ba, and Cu atoms can be observed, O atoms cannot be seen directly. Given these two characteristics, it can be concluded that atoms that are observed in the ABF image but not observed in the HAADF image are oxygen atoms. In the HAADF image, atoms are present at the points of white contrast; in the ABF image, atoms are present at the places of black contrast. The incidence direction of the electron beam in these images is the (100) direction. When a double CuO chain is observed in the ABF image, portions are observed where there are consecutive O atom vacancies in a portion of one CuO chain among the chains constituting the double CuO chain indicated by the arrows. These portions where there are consecutive O atom vacancies are also thought to act as pinning centers, and to contribute to an increase in $J_c$.

Comparative Example 1

A thin film superconducting element including a superconducting oxide thin film in which normal YBCO (Y-123), and a superlattice structure thereof (including simple lamination defects and modulated structures) or the like was present in mixture in a superconducting layer was produced by performing the same processes as those described above (under Manufacture of Thin film Superconducting Element) up to forming of the $CeO_2$ intermediate layer, and then performing the processing described below.

A solution of organic complexes of Y, Ba, and Cu that had been applied to the surface of the $CeO_2$ intermediate layer using a spin coater was preliminarily sintered at 500° C. in air, the temperature was then increased to 800° C. in an atmosphere with an oxygen concentration of from 10 ppm to 100 ppm and sintering was performed, and the atmosphere was then replaced by a 100% oxygen atmosphere while decreasing the temperature, as a result of which a YBCO layer was obtained. A YBCO layer in which Cu vacancies did not occur in the Cu—O chains was obtained thereby. An oxide superconductor thin film was produced by the above manufacturing method.

A thin film superconducting element was produced by depositing a gold-silver alloy on the obtained superconducting oxide thin film using a sputtering method, and attaching electrodes thereto.

This sample exhibited a critical current density of $J_c=3$ MA/cm$^2$. The sample was evaluated according to the HAADF method using aberration corrected STEM. The TEM image thereof is illustrated in FIG. 6. Cu vacancies in the CuO chains like those observed in Example 1 were not detected in this sample.

Although the above explanation of the invention is performed using an embodiment, obviously the technical scope of the invention is not limited to the scope of the embodiment. It will be obvious to a person of ordinary skill in the art that various modification or improvements may be made to the above embodiment. Embodiments arrived at by such modifications and improvements are also included in the technical scope of the invention, as is apparent from the recitations of the claims.

The disclosure of Japanese Patent Application No. 2012-243004, filed Nov. 2, 2012, is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

EXPLANATION OF REFERENCE NUMERALS

1 superconducting oxide thin film
11 substrate
12 intermediate layer
12 superconducting layer
14 stabilizing layer
20 RE-based superconductor
21 Cu
22 RE
24 CuO$_2$ plane
26 CuO single chain
27 CuO double chain

The invention claimed is:

1. A superconducting oxide thin film, comprising a superconducting layer formed on a supporting material, the superconducting layer including an RE-based superconductor as a main component, and the RE-based superconductor including a CuO chain having a Cu vacancy portion.

2. The superconducting oxide thin film of claim 1, wherein the RE-based superconductor includes a CuO single chain as the CuO chain, and the Cu vacancy portion is a linear defect formed by consecutive vacancies of Cu atoms in the CuO single chain.

3. The superconducting oxide thin film of claim 2, wherein the Cu vacancy portion is a linear defect formed by consecutive vacancies of Cu atoms along a chain direction in the CuO single chain.

4. The superconducting oxide thin film of claim 1, wherein the RE-based superconductor includes a CuO single chain as the CuO chain, the Cu vacancy portion is formed by consecutive vacancies of Cu atoms in the CuO single chain along a b-axis direction of a crystal structure of the RE-based superconductor, and the RE-based superconductor includes a plurality of Cu vacancy portions along an a-axis direction of the crystal structure, and includes Cu atoms at positions between the plurality of Cu vacancy portions arranged in the a-axis direction.

5. The superconducting oxide thin film of claim 1, wherein the RE-based superconductor includes a CuO double chain as the CuO chain, and the Cu vacancy portion is formed by consecutive vacancies of Cu atoms in a chain direction in at least one CuO chain of two CuO chains in the CuO double chain.

6. The superconducting oxide thin film of claim 1, wherein the RE-based superconductor includes a CuO single chain and a CuO double chain as the CuO chain, and the Cu vacancy portion is formed by consecutive vacancies of Cu atoms in a chain direction in at least one CuO chain among a plurality of CuO chains configuring the CuO single chain and the CuO double chain.

7. The superconducting oxide thin film of claim 1, wherein the RE-based superconductor includes a CuO double chain as the CuO chain, and an oxygen atom vacancy is included in one CuO chain among CuO chains configuring the CuO double chain.

* * * * *